United States Patent [19]

Kuriyama

[11] Patent Number: 5,773,873
[45] Date of Patent: Jun. 30, 1998

[54] SEMICONDUCTOR DEVICE HAVING MULTI-EMITTER STRUCTURE

[75] Inventor: Yasuhiko Kuriyama, Kanagawa, Japan

[73] Assignee: Kabushiki Kaisha Toshiba, Kawasaki, Japan

[21] Appl. No.: 614,254

[22] Filed: Mar. 12, 1996

[30] Foreign Application Priority Data

Mar. 15, 1995 [JP] Japan ...................................... 7-055795

[51] Int. Cl.$^6$ .......................... H01L 29/00; H01L 27/082
[52] U.S. Cl. ........................... 257/563; 257/564; 257/577
[58] Field of Search ..................................... 257/563, 564, 257/577, 578, 579, 580, 582; 327/489, 563

[56] References Cited

U.S. PATENT DOCUMENTS

| 4,119,994 | 10/1978 | Jain et al. | 257/197 |
| 5,438,296 | 8/1995 | Kimura | 327/563 |
| 5,648,741 | 7/1997 | Wichern | 327/563 |
| 5,661,329 | 8/1997 | Hiramoto et al. | 257/347 |

OTHER PUBLICATIONS

Shimura et al., "1W Ku–band AlGAs/GaAs Power HBTs with 72% Peak Power–Added Efficiency", IEEE MTT–S Digest, pp. 687–690 (1994).

Yamauchi et al., "10 Gb/s Monolithic Optical Modulator Driver with High Output Voltage of 5 V Using InGaP/GaAs HBTs", IEEE GaAs IC Symposium Digest, pp. 207–210, (1994).

Primary Examiner—Wael Fahmy
Attorney, Agent, or Firm—Foley & Lardner

[57] ABSTRACT

A semiconductor device having a differential amplifier circuit portion made of two multi-emitter bipolar transistors (BPT). Each multi-emitter BPT has the same number of a plurality of transistor elements each having an independent emitter electrode. Each transistor element of one multi-emitter BPT and a corresponding transistor element of the other multi-emitter BPT form a transistor element pair, with the emitter electrodes thereof being electrically connected. Each transistor element pair is electrically independent from other transistor element pairs, and the emitter electrodes of each transistor element pair are connected to an emitter current source independently from other emitter current sources.

19 Claims, 10 Drawing Sheets

SEMICONDUCTOR DEVICE HAVING MULTI-EMITTER STRUCTURE

BACKGROUND OF THE INVENTION

1. Field of the Invention

The present invention relates to a semiconductor device constituted by multi-emitter transistors and the like, and more particularly to a semiconductor device capable of preventing transistors from breaking down through current concentration.

2. Description of the Prior Art

Figure 1:
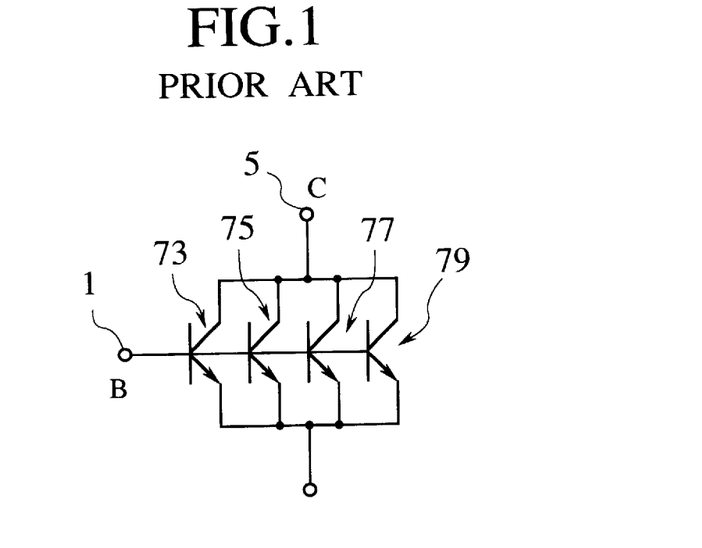
FIG. 1 is an equivalent circuit diagram used for explaining a conventional multi-emitter bipolar transistor.

In assembling a current switching circuit of 10 mA or larger by using bipolar transistors, single-emitter transistors connected in parallel may be used or a so-called multi-emitter transistor having an emitter pattern divided in parallel may be used. An equivalent circuit diagram of a multi-emitter transistor is shown in FIG. 1. In FIG. 1, a multi-emitter transistor is made of four transistor elements 73, 75, 77, and 79. The emitter, base, and collector regions of respective transistor elements are electrically connected by surface metal wiring patterns on a single transistor chip.

Figure 2:
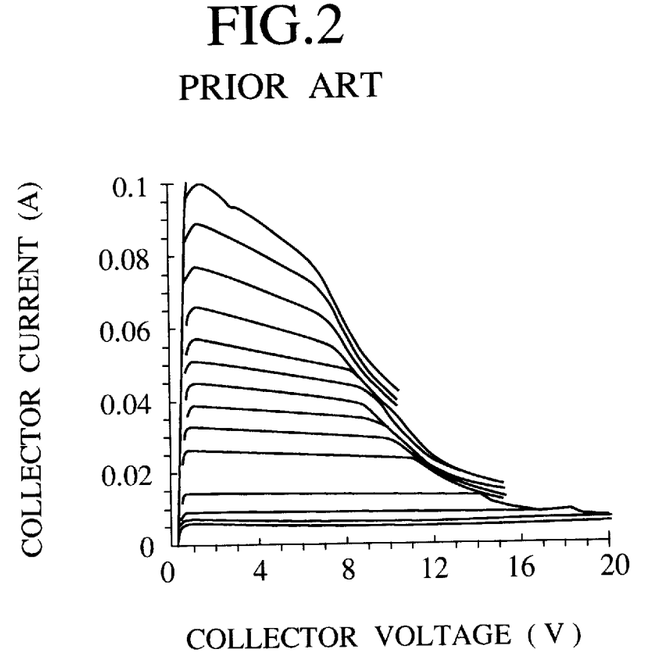
FIG. 2 shows the current-voltage characteristics of a conventional multi-emitter bipolar transistor.

A bipolar transistor has the characteristics that as the collector current increases, the temperature of the transistor rises and the on-voltage of the transistor rises correspondingly, further increasing the collector current. Specifically, in the multi-emitter transistor shown in FIG. 1, current concentrates rapidly on the transistor element part having the largest temperature rise (generally, of the transistor element 75 or 77 near at the center of the chip). This current concentration causes a further current concentration through positive feedback, and poses a problem of breakdown. FIG. 2 shows the characteristics of a multi-emitter transistor illustrating a breakdown by positive feedback. This breakdown is ascribed to the following two reasons:

(i) collector current of a bipolar transistor is very sensitive to an input voltage; and (ii) as the temperature rises, the on-voltage rises, i.e., current becomes easy to flow. A compound semiconductor device such as gallium arsenide based heterojunction bipolar transistors (HBTs) has a poor thermal conductivity so that current concentration becomes conspicuous particularly when the transistor is operated at a large current density.

Figure 3:
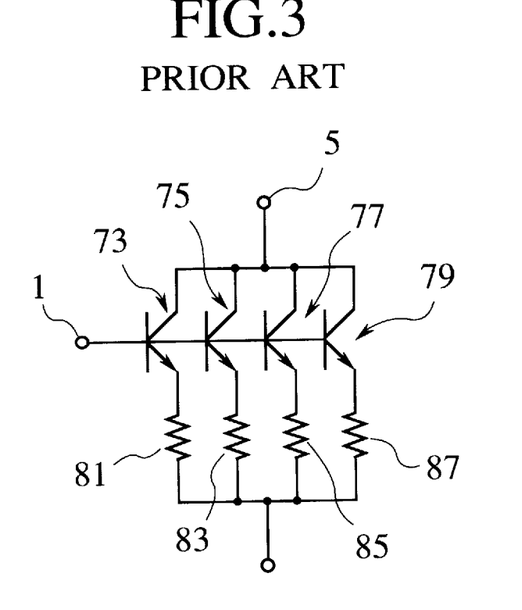
FIG. 3 is a diagram used for explaining a conventional technique of preventing current concentration of a conventional multi-emitter bipolar transistor.

In order to prevent a breakdown of a multi-emitter transistor to be caused by current concentration, a method has been proposed which, as shown in FIG. 3, lowers input sensitivities by inserting ballasting resistors 81, 83, 85, and 87 in series with transistor elements. However, insertion of the ballasting resistors 81, 83, 85, and 87 lowers the transconductance $g_m$ of the bipolar transistor, posing another problem of a low voltage gain of the bipolar transistor.

The breakdown modes described above are also true for single-emitter transistors connected in parallel. Namely, any circuit having bipolar transistors operating in parallel at a large current of 10 mA to 1 A or larger has a possibility of being associated with such breakdown modes. One example of such a circuit is a differential amplifier circuit using multi-emitter transistors whose equivalent circuit diagram is given in FIG. 4.

Figure 4:
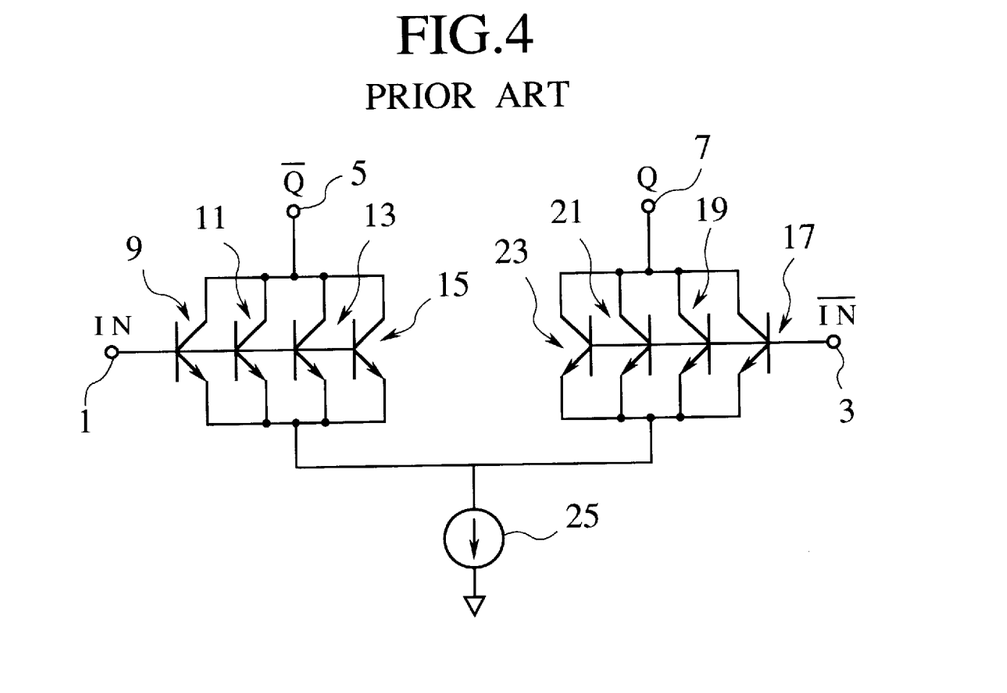
FIG. 4 is an equivalent circuit diagram of a differential amplifier circuit using conventional multi-emitter bipolar transistors.

Referring to FIG. 4, this differential amplifier circuit is formed by a first multi-emitter transistor constituted by transistor elements 9, 11, 13, and 15, a second multi-emitter transistor constituted by transistor elements 17, 19, 21, and 23, and a current source 25.

The collector terminals of the transistor elements 9, 11, 13, and 15 are connected by a common electrode wiring pattern to a collector output terminal 5 of the first multi-emitter transistor and the base terminals of the transistor elements 9, 11, 13, and 15 are connected to a common base terminal 1 of the first multi-emitter transistor, whereas the collector terminals of the transistor elements 17, 19, 21, and 23 are connected by a common electrode wiring pattern to a collector output terminal 7 of the second multi-emitter transistor and the base terminals of the transistor elements 17, 19, 21, and 23 are connected to a common base terminal 3 of the second multi-emitter transistor.

The emitter terminals of the transistor elements 9, 11, 13, and 15 and the emitter terminals of the transistor elements 17, 19, 21, and 23 are connected to respective common emitter output terminals which are connected in common to a constant current source 25.

With this circuit arrangement, when signals are applied to the base terminals 1 and 3 of the first and second multi-emitter transistors and these multi-emitter transistors turn on, current flows through the transistor elements 9, 11, 13, and 15 or through the transistor elements 17, 19, 21, and 23. Under these conditions, the transistor element having the highest temperature rise breaks down because of the above-described breakdown modes.

As described above, both of the two circuits, one circuit using single-emitter transistor patterns connected in parallel by surface wiring patterns and disposed on semiconductor chips each connected by external circuits and the other circuit using a so-called multi-emitter transistors, are associated with the above-described problems. Namely, current concentrates abruptly on a single-emitter transistor part or a transistor element part of the multi-emitter transistor having the highest temperature rise during the circuit operation, and this part breaks down.

SUMMARY OF THE INVENTION

The invention has been made in view of the above circumstances. It is an object of the present invention to provide a semiconductor device capable of preventing a transistor from being broken down by current concentration caused by temperature rise, without lowering a voltage gain, even under a large current operation of a circuit using single-emitter transistor patterns or single-emitter transistor chips disposed in parallel, or of a circuit using the so-called multi-emitter transistors having emitter patterns divided in parallel.

In order to achieve the above object, the invention has the characteristics that as shown in FIGS. 5, 6A, 6B, 8, 9, 10 and 11, multi-emitter bipolar transistors with a plurality of transistor elements 9, 11, 13, and 15; and 17, 19, 21, and 23 disposed in parallel on the same semiconductor substrate have emitter electrodes 409, 411, 413, 415; and 417, 419, 421, and 423 which are formed electrically independent, and these independent emitter electrodes are connected to independently constant current sources 25, 27, 29, and 31.

Figure 5:
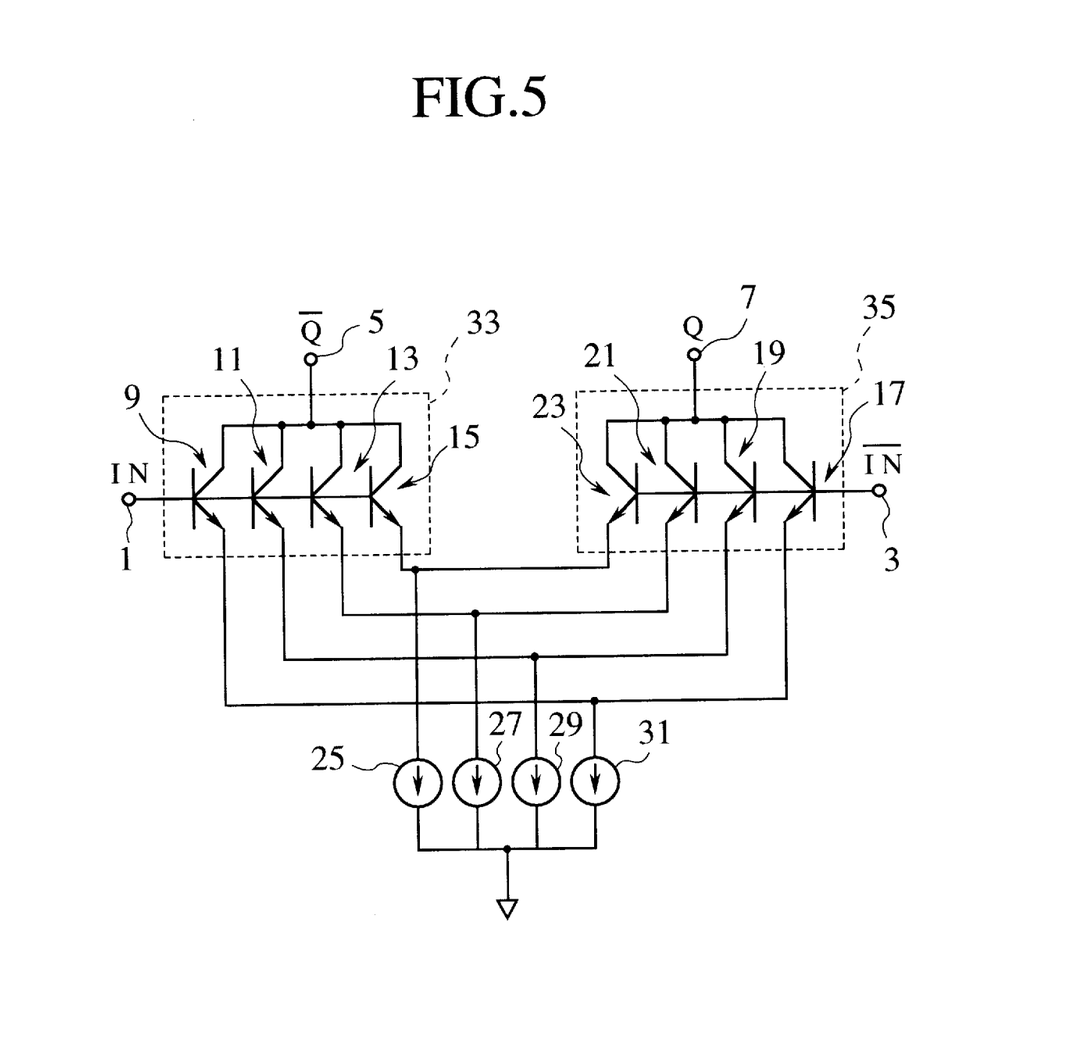
FIG. 5 is an equivalent circuit diagram of a differential amplifier circuit of a first embodiment of the invention.
Figure 6A:
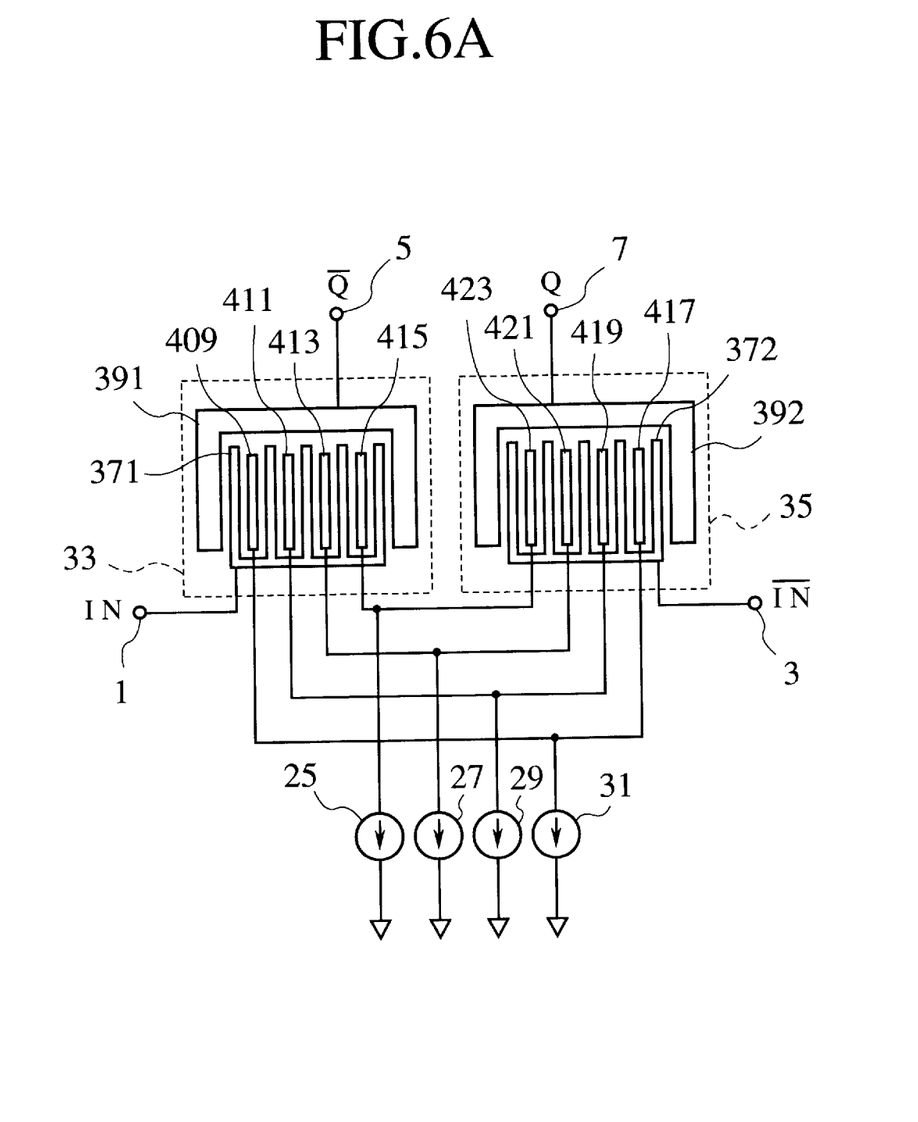
FIG. 6A is a diagram showing part of a pattern layout of a semiconductor chip of the differential amplifier circuit shown in FIG. 5.
Figure 6B:
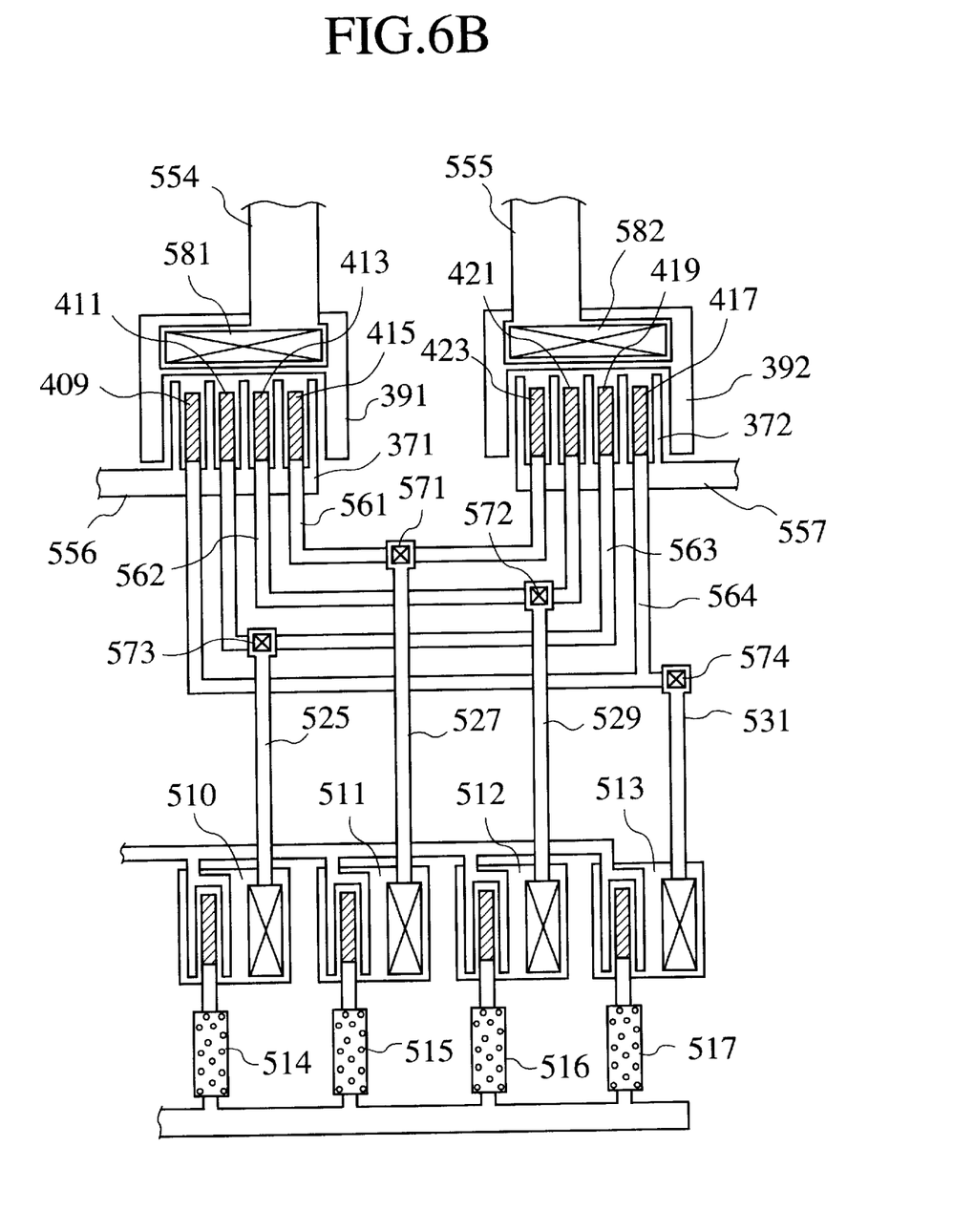
FIG. 6B is a diagram showing a pattern layout of a connection area between multi-emitter transistors and constant current sources of the differential amplifier circuit shown in FIG. 5.

The aspect of the invention resides particularly in that as shown in FIGS. 5, 6A and 6B, in a differential amplifier circuit made of first and second multi-emitter bipolar transistors 33 and 35, the emitter electrode 409 of the first multi-emitter bipolar transistor and the emitter electrode 417 of the second multi-emitter bipolar transistor form a transistor element pair and are connected to a common emitter terminal to which a constant current source 31 is connected. The aspect of the invention also resides in that as seen from FIGS. 6A and 6B, emitter electrodes 411 and 419, 413 and 421; and 415 and 423 are connected to respective independent emitter terminals to form transistor element pairs, which terminals are connected to respective independent constant current sources 29, 27, and 25.

As shown in FIGS. 5, 6A, and 6B, the emitter electrodes of one transistor pair are connected together independently from other transistor pairs and connected to a corresponding one of the independent constant current sources 25, 27, 29, and 31. Accordingly, current concentration in a particular transistor pair otherwise caused by a temperature rise can be avoided and breakdown of the multi-emitter bipolar transistors 33 and 35 can be prevented.

The multi-emitter bipolar transistors 33 and 35 shown in FIGS. 6A and 6B each have four emitter electrodes 409, 411, 413, 415; and 417, 419, 421, and 423. The number of emitter electrodes may be set arbitrary if it is two or larger. Namely, the number of emitter electrodes is designed depending upon a necessary output current, and it may obviously be several hundreds to several hundred thousands.

Figure 8:
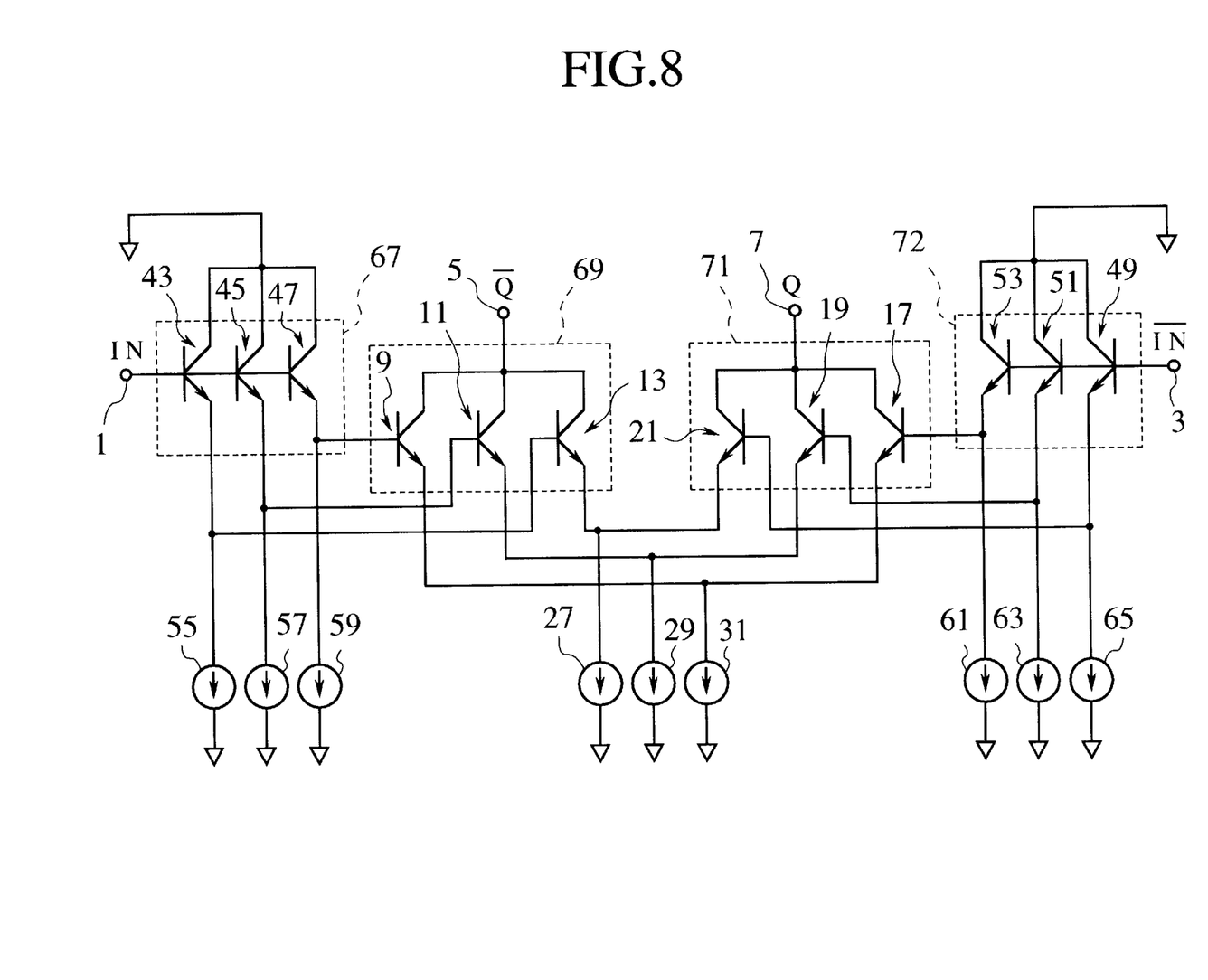
FIG. 8 is an equivalent circuit diagram of a differential amplifier circuit according to the second embodiment of the invention.
Figure 9:
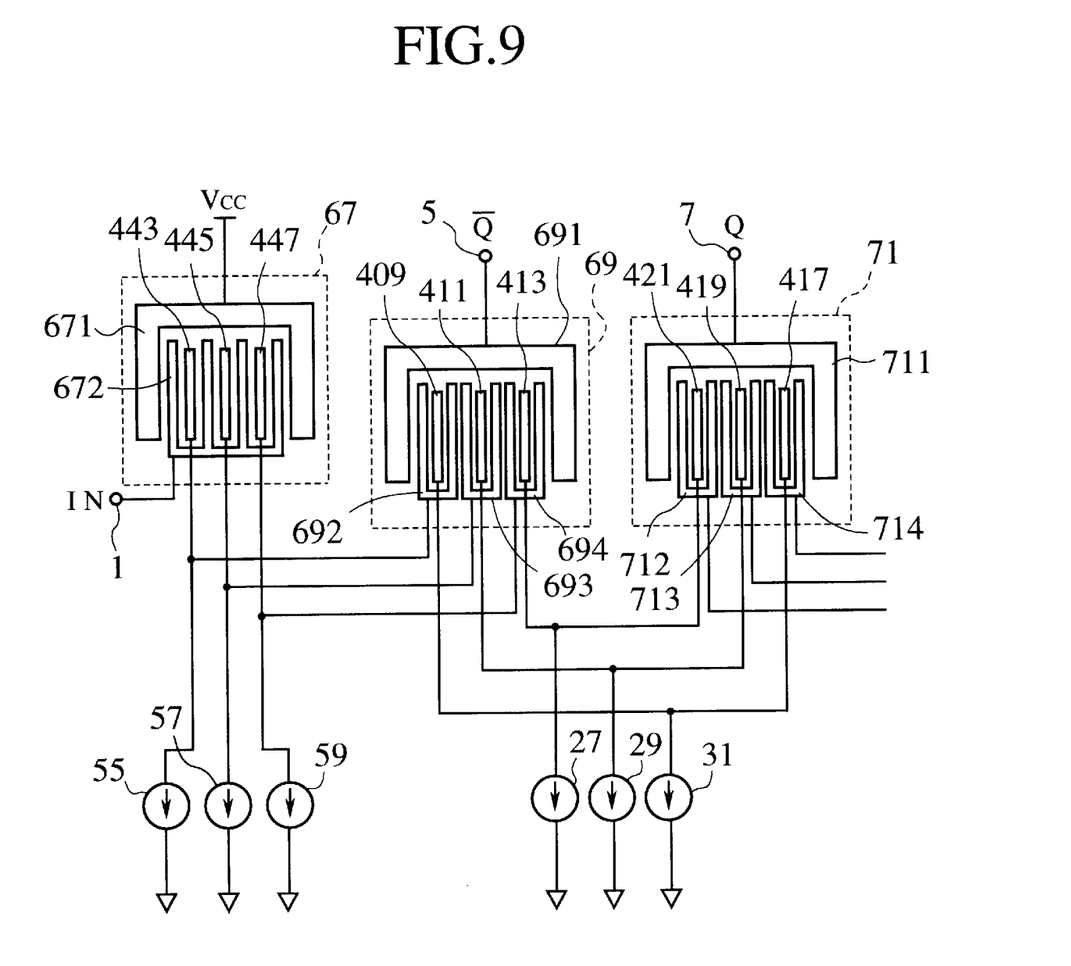
FIG. 9 is a diagram showing part of a layout pattern of a semiconductor chip of the differential amplifier circuit shown in FIG. 9.

The technical concept of the invention that each paired emitter electrode of transistor elements is formed independently from other paired emitter electrodes and connected to an independent constant current source, is applicable to a variety of other fields. For example, as shown in FIGS. 8 and 9, third and fourth multi-emitter bipolar transistors 67 and 72 functioning as emitter followers may be added. As shown in FIG. 9, base electrodes 692, 693, 694; and 712, 713, 714 of the first and second multi-emitter bipolar transistors are also connected electrically independently and paired with the emitter electrodes of the third and fourth multi-emitter bipolar transistors 67 and 72. Specifically, as shown in FIGS. 8 and 9, the emitter electrode 443 is paired with the base electrode 692 and connected via a common emitter terminal to a constant current source 55. Similarly, the emitter electrode 445 is paired with the base electrode 693 and connected to a constant current source 57, and the emitter electrode 447 is paired with the base electrode 694 and connected to a constant current source 59.

Figure 10:
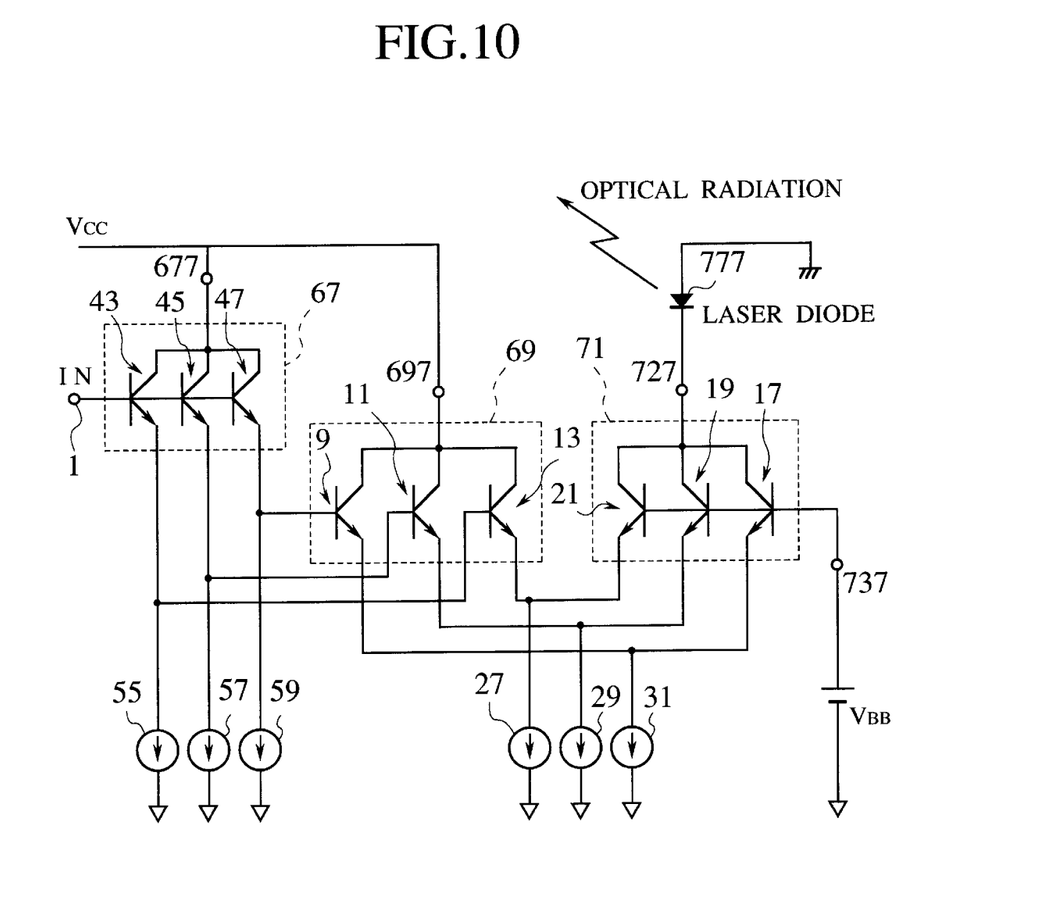
FIG. 10 is an equivalent circuit of a laser diode drive circuit according to a third embodiment of the invention.

The application field of the technical concept of the invention is not limited only to a multi-emitter bipolar transistor having transistor elements disposed in parallel on the same semiconductor substrate, but the technical concept is also applicable to general circuits so long as they can be represented by the equivalent circuits shown in FIGS. 5, 8, and 10. For example, it is obvious that single-emitter transistors fabricated on a semiconductor chip may be connected by surface metal wiring patterns or single-emitter transistors assembled on a substrate such as a ceramic substrate and an insulated metal substrate may be connected by external wiring.

As described above, in the both cases where single-emitter transistors are disposed in parallel and where the so-called multi-emitter transistors each having divided emitter patterns are disposed in parallel and formed on the same semiconductor substrate, a single-emitter transistor pair or a transistor element pair is formed, and each pair of single-emitter transistors or transistor elements is electrically connected together independently from other pairs and connected to a corresponding one of independent constant current sources. Accordingly, even if a difference in an on-voltage is generated between emitters due to a temperature rise, current will not concentrate on a particular single-emitter transistor or transistor element so that breakdown of the semiconductor device as a whole can be prevented. Furthermore, since there is no current concentration and the stable operation is ensured, it is easy to increase collector current and raise collector voltage. Therefore, the performance of a high output differential amplifier circuit or other circuits can be improved, allowing high speed and large current switching or other operations.

Stable high speed and large current operations of power ICs are possible, particularly for those power ICs posing a possible problem of lack of a heat dissipation ability and current concentration, such as compound semiconductor power ICs, for example, HBTs, and silicon bipolar power ICs formed on SOI substrates having a dielectric isolation (DI) structure.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(1st Embodiment)

FIG. 5 is a circuit diagram of a differential amplifier circuit according to the first embodiment of the present invention. As shown in FIG. 5, this differential amplifier circuit has a first multi-emitter transistor 33 constituted by transistor elements 9, 11, 13, and 15 of AlGaAs/GaAs HBTs, a second multi-emitter transistor 35 constituted by transistor elements 17, 19, 21, and 23 of AlGaAs/GaAs HBTs, and current sources 25, 27, 29, and 31. The collector electrodes of the transistor elements 9, 11, 13, and 15 are connected to a collector output terminal 5 of the first multi-emitter transistor and the base electrodes of the transistor elements 9, 11, 13, and 15 are connected to a base terminal 1 of the first multi-emitter transistor, respectively by surface metal wiring patterns such as Au and Al films formed on the chip surface. The collector electrodes of the transistor elements 17, 19, 21, and 23 are connected to a collector output terminal 7 of the second multi-emitter transistor and the base electrodes of the transistor elements 17, 19, 21, and 23 are connected to a base terminal 3 of the second multi-emitter transistor, respectively by surface metal wiring patterns. The collector electrode of each transistor element is a metal electrode made of, for example, AuGe/Au, AuGe/Ni/Au, or AuGe/Ni/Ti/Au, whereas the base electrode of each transistor element is a metal electrode made of, for example, Ti/Pt/Au, Au/Zn/Au, or Pt/Ti/Pt/Au.

The two multi-emitter transistors 33 and 35 of the differential amplifier circuit shown in FIG. 5 are made of transistor element pairs, including a pair of transistor elements 9 and 17, a pair of transistor elements 11 and 19, a pair of transistor elements 13 and 21, and a pair of transistor elements 15 and 23. The emitter electrodes of the transistor elements 9, 11, 13, and 15 of the first multi-emitter transistor 33 are metal electrodes made of, for example, AuGe/Au, AuGe/Ni/Au, or AuGe/Ni/Ti/Au. Each pair of emitter electrodes of respective pairs of transistor elements 9 and 17; 11 and 19; 13 and 21; and 15 and 23 is connected together by a surface metal wiring pattern such as Au and Al films separately from other pairs, and connected to a corresponding one of independent constant current sources 25, 27, 29, and 31. The constant current sources 25, 27, 29, and 31 are implemented on the same GaAs substrate as of the first and second multi-emitter transistors 33 and 35. Connection to each constant current source is also established by a surface wiring pattern made of a high conductivity thin film such as Au and Al. FIG. 6A is a diagram showing a pattern layout near the first and second multi-emitter transistors 33 and 35 of the differential amplifier circuit shown in FIG. 5. FIG. 6B is a diagram showing a pattern layout of a connection area between the first and second multi-emitter transistors 33 and 35 and the constant current sources 25, 27, 29, and 31. Referring to FIGS. 6A and 6B, on a GaAs substrate the first and second multi-emitter transistors 33 and 35 are formed which are separated by an element separation region such as a proton (H$^+$) implanted region. Base electrode regions 371 and 372 and collector electrode regions 391 and 392 of the first and second multi-emitter transistors 33 and 35 are made of a first layer surface metal wiring pattern on the chip and are used in common for respective transistor elements. Emitter electrodes 409 and 417 of the transistor pair are electrically connected together by a second layer surface wiring pattern 564, independently from other transistor pairs. Between the second layer surface wiring pattern 564 and a first layer surface wiring pattern forming the base electrodes 371 and 372, a first interlayer insulating film made of, for example, SiO$_2$ or Si$_3$N$_4$, is interposed. Similarly, emitter electrodes 411 and 419; 413 and 421; and 415 and 423 of the other transistor pairs are electrically connected together by the second layer surface metal wiring patterns 563, 562, and 561, independently from other transistor pairs.

A second interlayer insulating film such as SiO$_2$ and Si$_3$N$_4$ is formed over the second layer surface metal wiring patterns 561, 562, 563, and 564 and the collector electrodes 391 and 392. The second layer surface metal wiring patterns 561, 562, 563, and 564 are respectively connected, via contact holes 573, 571, 572, and 574 formed in the second interlayer insulating film, to third layer surface metal wiring patterns 525, 527, 529, and 531 which are respectively connected to the constant current sources 25, 27, 29, and 31. As shown in FIG. 6B, the constant current sources 25, 27, 29, and 31 have output transistors 510, 511, 512, and 513 and resistors 514, 515, 516, and 517. Second layer surface metal wiring patterns 554 and 555 connected to the collector output terminals 5 and 7 are connected to the collector electrodes 391 and 392 via contact holes 581 and 582 formed on and above the collector electrodes 391 and 392.

With this circuit arrangement, when signals are applied to the base terminals 1 and 3 and the first or second multi-emitter transistor turns on, current from the current source 31 flows through the emitter 409 or 417 of the transistor element 9 or 17, current from the current source 29 flows through the emitter 411 or 419 of the transistor element 11 or 19, current from the current source 27 flows through the emitter 413 or 421 of the transistor element 13 or 21, and current from the current source 25 flows through the emitter 415 or 423 of the transistor element 15 or 23, respectively independently from other transistor elements.

Since an independent current source is connected to the emitters of each transistor element pair, even if a temperature rise causes a difference in the on-voltage between transistor elements, the current will not concentrate on a particular transistor element and a transistor breakdown can be prevented.

Figure 7:
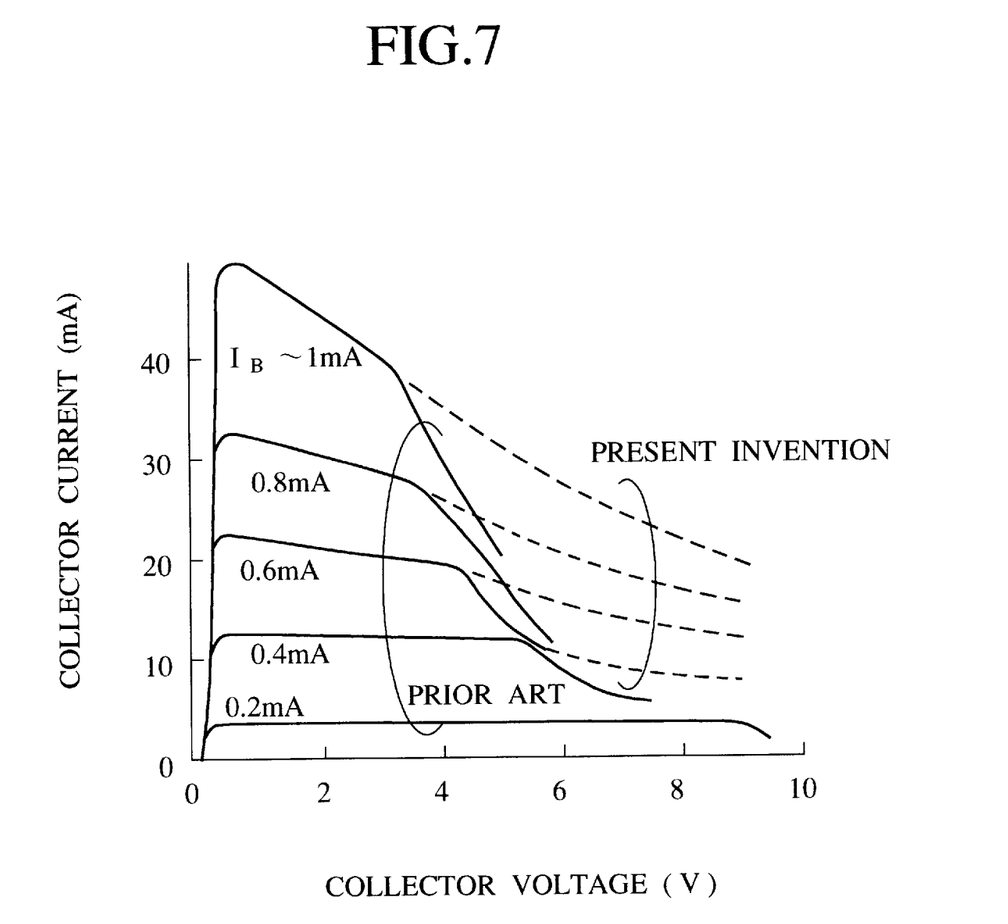
FIG. 7 is a diagram showing the current-voltage characteristics of a multi-emitter bipolar transistor used by differential amplifier circuits of the first and second embodiments of the invention, with a comparison to the conventional current-voltage characteristics.

FIG. 7 shows the current-voltage characteristics of the AlGaAs/GaAs multi-emitter HBTs 33 and 35 of the first embodiment of the invention, with a comparison to the characteristics of conventional AlGaAs/GaAs multi-emitter HBTs. Solid lines indicate the characteristics of conventional multi-emitter HBTs, and broken lines indicate the characteristics of multi-emitter HBTs of the first embodiment of the present invention. The emitter size of the AlGaAs/GaAs multi-emitter HBT of the first embodiment of the invention is 2 $\mu$m×10 $\mu$m, and the emitter pattern has four divided parallel emitters. The size and number of emitters may be designed as desired depending upon a required switching speed and current. Obviously other bipolar transistors may be used, such as InGaAs/GaAs multi-emitter HBTs, InP/InGaAs multi-emitter HBTs, InAlAs/InGaAs multi-emitter HBTs, and InGaP/InGaAs/GaAs multi-emitter HBTs.

As indicated by solid lines in FIGS. 2 and 7 in the current-voltage characteristics of a multi-emitter HBT of a conventional differential amplifier circuit described with FIG. 4, as the voltage rises over a predetermined level, the current gain lowers abruptly and the transistor stops its operation. The reason for this is as following. Since one current source 25 supplies current to four emitters, the current from the current source is concentrated at one emitter in which the heat causes a temperature rise, and the transistor breaks down. On the other hand, as indicated by broken lines in FIG. 7 in the current-voltage characteristics of the multi-emitter HBT of the first embodiment of the invention, even if the collector voltage becomes high, an abrupt current reduction will not occur so that a large output can be obtained. The reason for this is as following. The emitter electrodes of each transistor element pair constituting the two multi-emitter HBTs 33 and 35 have a common terminal connected by the surface metal wiring pattern, and the common terminal is connected to a corresponding one of the independent current sources 25, 27, 29, and 31. With this circuit arrangement, even in the large output range at a high collector voltage, current will not concentrate on a particular single emitter and the transistor element is hard to break down. Even if a transistor element is broken down, influence on the other transistor element pairs can be suppressed and minimized.

(2nd Embodiment)

FIG. 8 is a circuit diagram of a differential amplifier circuit according to the second embodiment of the invention. Referring to FIG. 8, this differential amplifier circuit has a first multi-emitter transistor 69 constituted by transistor elements 9, 11, and 13, a second multi-emitter transistor 71 constituted by transistor elements 17, 19, and 21, a third multi-emitter transistor 67 constituted by transistor elements 43, 45, and 47, a fourth multi-emitter transistor 72 constituted by transistor elements 49, 51, and 53, and constant current sources 27, 29, 31; 55, 57, 59; and 61,63, 65. Although the first to fourth multi-emitter transistors 69, 71, 67, and 72 are AlGaAs/GaAs HBTs, obviously other multi-emitter transistors may also be used. The third and fourth multi-emitter transistors 67 and 72 function as emitter followers. All the first to fourth multi-emitter transistors 69, 71, 67, and 72 and constant current sources 27, 29, 31; 55, 57, 59; and 61, 63, 65 are integrated on the same GaAs substrate.

The collector electrodes of the transistor elements 9, 11, and 13 of the first multi-emitter transistor 69 are connected to a common collector output terminal 5 and the collector electrodes of the transistor elements 17, 19, and 21 of the second multi-emitter transistor 71 are connected to a common collector output terminal 7, respectively by surface metal wiring patterns made of, for example, Au or Al.

Emitter electrodes of each of a pair of transistor elements 9 and 17, a pair of transistor elements 11 and 19, and a pair of transistor elements 13 and 21 are connected together by a surface metal wiring pattern such as Au and Al, independently from other pairs. Specifically, the emitter electrodes of the transistor elements 9, 11, and 13 are connected to those of the transistor elements 17, 19, and 21 in the unit of each transistor pair by the surface metal wiring pattern, and the surface metal wiring pattern interconnecting the emitter electrodes of the transistor element pair is connected to a corresponding one of the independent constant current sources 27, 29, and 31.

The emitter electrodes of the transistor elements 43, 45, and 47 constituting the third multi-emitter transistor 67 are connected to the base electrodes of the transistor elements 13, 11, and 9 of the first multi-emitter transistor 69 by surface metal wiring patterns each being connected to a corresponding one of the independent constant current sources 55, 57, and 59. As different from the first embodiment, the base electrodes of the transistor elements 9, 11, and 13 are separated and independent. Similarly, the emitter electrodes of the transistor elements 49, 51, and 53 constituting the fourth multi-emitter transistor 72 are connected to the base electrodes of the transistor elements 21, 19, and 17 of the second multi-emitter transistor 71 by surface metal wiring patterns each being connected to a corresponding one of the independent constant current sources 61, 63, and 65. The base electrodes of the transistor elements 43, 45,and 47 are connected to a common base input terminal 1and the base electrodes of the transistor elements 49,51, and 53 are connected to a common base input terminal3, respectively by surface metal patterns. The collector electrodes of the transistor elements 43, 45, and 47 are connected to a common collector terminal by a surface metal wiring pattern which is grounded. Similarly, the collector electrodes of the transistor elements 49, 51, and 53 are connected to a common collector terminal by a surface metal wiring pattern which is grounded or applied with a predetermined potential, the transistor elements 49, 51, and 53 also functioning as emitter followers.

FIG. 9 shows a pattern layout of part of the differential amplifier circuit of the second embodiment of the invention shown in FIG. 8, the layout showing mainly the area around the first to third multi-emitter transistors 67, 69, and 71. Referring to FIG. 9, a base electrode 672 and a collector electrode 671 of the third multi-emitter transistor 67 each form a common electrode connecting the transistor elements by a surface metal wiring pattern. On the other hand, emitter electrodes 443, 445, and 447 of the third multi-emitter transistor 67 are formed separately for each transistor element. Base electrodes 692, 693, and 694 of the first multi-emitter transistor 69 and base electrodes 712, 713, and 714 of the second multi-emitter transistor 71 are formed separately.

As seen from FIG. 9, similar to the first embodiment of the invention, in the third multi-emitter transistor 67 functioning as an emitter follower, the constant current source 55 is connected to the transistor element 43 at the emitter electrode 443, the constant current source 57 is connected to the transistor element 45 via the emitter electrode 445, and the constant current source 59 is connected to the transistor element 47 via the emitter electrode 447. The emitter electrode 443 is connected to the base electrode 692, the emitter electrode 445 is connected to the base electrode 693, and the emitter electrode 447 is connected to the base electrode 694, respectively by surface metal wiring patterns. Although not shown in FIG. 9, the fourth multi-emitter transistor is structured as seen from FIG. 8 such that the transistor element 49 is supplied with current only from the constant current source 65, the transistor element 51 is supplied with current only from the constant current source 63, and the transistor element 53 is supplied with current only from the constant current source 61.

In the second embodiment of the invention, not only the first and second multi-emitter transistors 69 and 71 but also the third and fourth multi-emitter transistors 67 and 72 functioning as emitter followers are not associated with an abrupt current reduction even at a large power operation at a high collector voltage. Accordingly, with the second embodiment of the invention, the problem of current concentration by a temperature rise can be settled and a large output is possible.

(3rd Embodiment)

FIG. 10 is a circuit diagram of a laser diode drive circuit according to the third embodiment of the invention. The drive circuit of the third embodiment of the invention is a power IC using a circuit similar to the differential amplifier circuit of the second embodiment.

Referring to FIG. 10, this laser diode driver has a first multi-emitter transistor 69 constituted by transistor elements 9, 11, and 13, a second multi-emitter transistor 71 constituted by transistor elements 17, 19, and 21, a third multi-emitter transistor 67 constituted by transistor elements 43, 45, and 47, and constant current sources 27, 29, 31; and 55, 57, 59. The first to third multi-emitter transistors 69, 71, and 73 are all AlGaAs/GaAs HBTs and are integrated on the same GaAs substrate, together with the constant current sources 27, 29, 31; and 55, 57, 59. A collector terminal 727 of the second multi-emitter transistor 71 is connected to a semiconductor laser diode 777. The third multi-emitter transistor 67 functions as an emitter follower.

The collector electrodes of the transistor elements 9, 11, and 13 of the first multi-emitter transistor 69 are connected to a common collector output terminal 697 by a surface metal wiring pattern such as Au and Al, whereas the collector electrodes of the transistor elements 17, 19, and 21 of the second multi-emitter transistor 71 are connected to a common collector output terminal 727 by a surface metal wiring pattern. The collector electrodes of the transistor elements 43, 45, and 47 of the third multi-emitter transistor 67 are connected to a common collector output terminal 677 which is connected to a collector power source $V_{CC}$ to which the collector output terminal 697 of the first multi-emitter transistor 69 is also connected.

Emitter electrodes of each of a pair of transistor elements 9 and 17, a pair of transistor elements 11 and 19, and a pair of transistor elements 13 and 21 are connected together by a surface metal wiring pattern, independently from other pairs. Specifically, the emitter electrodes of the transistor elements 9, 11, and 13 are connected to those of the transistor elements 17, 19, and 21 in the unit of each transistor pair by the surface metal wiring pattern, and the surface metal wiring pattern interconnecting the emitter electrodes of the transistor element pair is connected to a corresponding one of the independent constant current sources 27, 29, and 31. The base electrodes of the transistor elements 9, 11, and 13 are each electrically separated. The emitter electrodes of the transistor elements 43, 45, and 47 constituting the third multi-emitter transistor 67 are respectively connected to the base electrodes of the transistor elements 13, 11, and 9 of the first multi-emitter transistor 69 by surface metal wiring patterns, and each surface metal wiring pattern interconnecting the base and emitter electrodes is connected to a corresponding one of the independent constant current sources 55, 57, and 59. The base electrodes of the transistor elements 43, 45, and 47 of the third multi-emitter transistor 67 are connected to a common base input terminal 1 to which an input signal is applied. The base electrodes of the transistor elements 17, 19, and 21 of the second multi-emitter transistor 71 are connected to a common base input terminal 737 to which a constant base bias voltage $V_{BB}$ is applied. The circuit arrangement described above allows large current necessary for driving the laser diode 777 to be easily and stably switched at high speed. For example, current of 10 mA to 1 A can be stably switched at high speed with a rise time of about 10 ps and a fall time of about 10 ps. Even if a temperature rises due to a large current operation for a long time and a difference of a non-voltage is generated between transistor elements, breakdown of transistors can be avoided because current will not concentrate on a particular transistor element. Furthermore, since a stable operation in a large power operation range is ensured, safety coefficients of design can be estimated lower so that collector current and voltage can be increased with ease. This drive circuit for driving a high output and high speed semiconductor laser can contribute to a high performance of an ultra high speed communications module. In addition, this circuit can be used very effectively as a power IC for switching other high power and high speed devices.

Various modifications will become possible for those skilled in the art after receiving the teachings of the present disclosure without departing from the scope thereof. In the above embodiments, although AlGaAs/GaAs HBTs are used, the technical concept of this invention is also applicable to various other power ICs whose current concentration by a temperature rise is feared. For example, instead of compound semiconductor devices, silicon power ICs may be used with similar advantageous effects as above. Si bipolar power ICs, particularly Si bipolar power ICs having trench isolation or dielectric isolation (DI) in an SOI substrate, have a poor thermal conductivity. Therefore, application of this invention to such Si bipolar power ICs is very effective.

Furthermore, in the above embodiments, a monolithic power IC is used whose multi-emitter transistors and constant current sources are all formed on the same chip. Instead, only some constant current sources may be integrated on the same substrate as of multi-emitter transistors. Obviously, depending upon the power and switching speed requirements, constant current sources may be formed on a substrate different from the substrate of multi-emitter transistors, these substrates being assembled on an organic material substrate such as a ceramic substrate and a glass epoxy substrate, or on an insulated metal substrate to form a multi-chip module (MCM) structure of a hybrid IC structure.

In the case of a large current operation with an increased number of emitters, instead of using a pair of two transistor elements, a pair of two groups each having the same number of a plurality of transistor elements may be used. This structure is useful because a complicated pattern layout and an increase of the number of constant current sources can be avoided.

Figure 11:
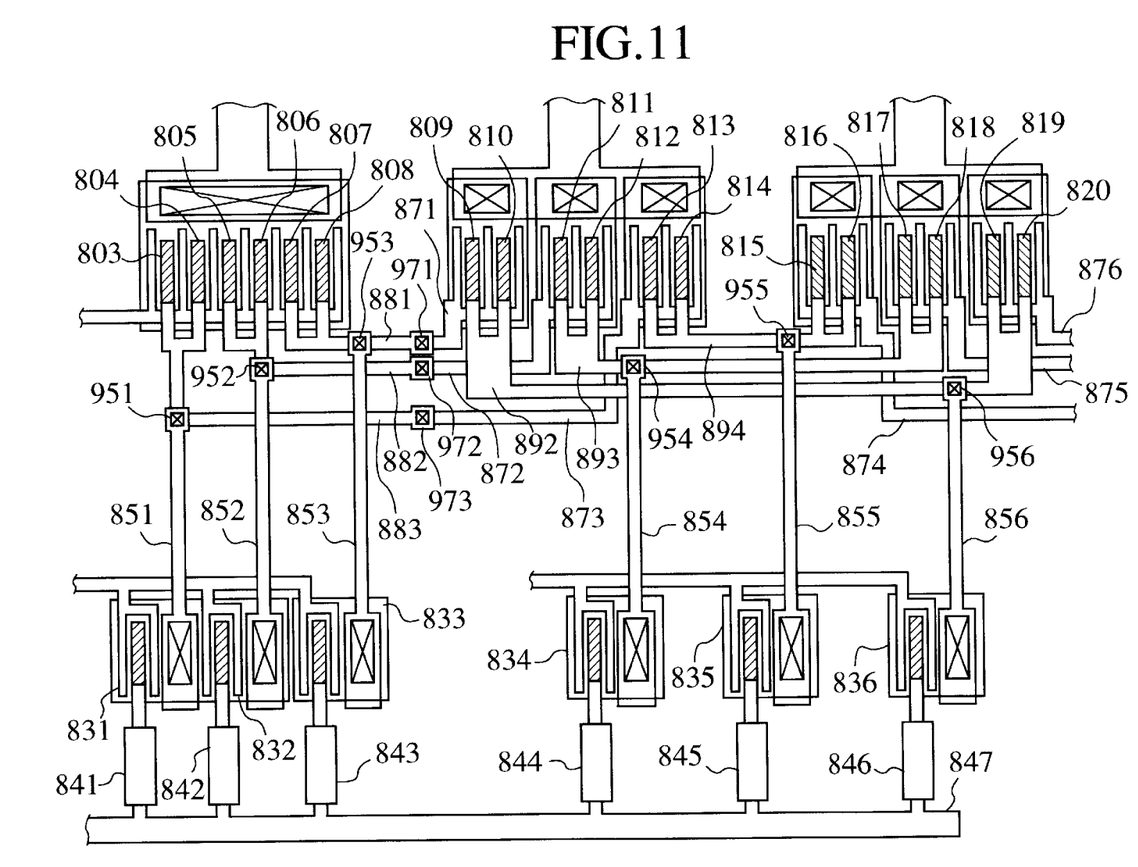
FIG. 11 is a diagram showing an example of a pattern layout for large current operation.

FIG. 11 shows an example of a pattern layout of a circuit using transistor element pairs each constituted by two groups each having a plurality of transistor elements. The circuit of the pattern layout shown in FIG. 11 is generally the same circuit as the equivalent circuit shown in FIG. 8. A first multi-emitter transistor 69 is constituted by six transistor elements having the emitter electrodes 809, 810, 811, 812, 813, and 814, and a second multi-emitter transistor 71 is constituted by six transistor elements having the emitter electrodes 815, 816, 817, 818, 819, and 820. A third multi-emitter transistor 67 is constituted by six transistor elements having the emitter electrodes 803, 804, 805, 806, 807, and 808. In the pattern layout shown in FIG. 11, one transistor element group is formed by two transistor elements, and a pair of two transistor element groups is connected together by a surface metal wiring pattern. Specifically, in the first and second multi-emitter transistors 69 and 71, the emitter electrodes of each element group are connected to the emitter electrodes of a corresponding paired element group by each of second layer surface metal wiring patterns 892, 893, and 894. In the third multi-emitter transistor 67, each set of the emitter electrodes 803 and 804; 805 and 806; and 807 and 808 of respective transistor element groups are connected together by a corresponding one of second layer surface metal wiring patterns 881, 882, and 883, and connected to a corresponding one of base electrode wiring patterns 871, 872, and 873 of the first multi-emitter transistor 69 made of a first layer surface metal wiring layer, via contact holes 971, 972, and 973. The second layer surface metal wiring patterns 881, 882, 883, 892, 893, and 894 are connected respectively to third layer surface metal wiring patterns 853, 852, 851, 854, 855, and 856 via contact holes 953, 952, 951, 954, 955, and 956 formed in an interlayer insulating film formed on the second layer surface metal wiring layer. These third layer surface metal wiring patterns 851, 852, . . . , 856 are connected to output transistors 831, 832, 833, 834, 835, and 836 of constant current sources. The output transistors 831, 832, . . . , 836 are connected via their resistors 841, 842, . . . , 846 to a power source wiring pattern 847.

In the example shown in FIG. 11, one transistor element group is formed by two transistor elements. The number of transistor elements constituting a single transistor element group may be selected depending upon design specifications, for example, three or more, ten or more, and so on. With a transistor element pair of groups, a layout pattern facilitating a large current design can be realized.

What is claimed is:

1. A semiconductor device having a differential amplifier with a first and a second input terminal, the differential amplifier comprising:

(a) a first multi-emitter bipolar transistor, comprising a first emitter electrode, a second emitter electrode electrically independent from said first emitter electrode, a third emitter electrode electrically independent from said first and second emitter electrodes, a first collector electrode common to said first, second and third emitter electrodes, and a first base electrode common to said first, second and third emitter electrodes, said first base electrode being the first input terminal;

(b) a second multi-emitter bipolar transistor, comprising a fourth emitter electrode, a fifth emitter electrode electrically independent from said fourth emitter electrode, a sixth emitter electrode electrically independent from said fourth and fifth emitter electrodes, a second collector electrode common to said fourth, fifth and sixth emitter electrodes, and a second base electrode common to said fourth, fifth and sixth emitter electrodes, said second base electrode being the second input terminal;

(c) a first emitter terminal interconnecting said first and fourth emitter electrodes;

(d) a second emitter terminal interconnecting said second and fifth emitter electrodes;

(e) a third emitter terminal interconnecting said second and fifth emitter electrodes (f) a first constant current source connected to said first emitter terminal;

(g) a second constant current source connected to said second emitter terminal; and (h) a third constant current source connected to said third emitter terminal.

2. A device as claimed in claim 1, wherein said first and second multi-emitter bipolar transistors are formed on the same semiconductor substrate.

3. A device as claimed in claim 1, wherein said first and second multi-emitter bipolar transistors and said first and second constant current sources are formed on the same semiconductor substrate.

4. A device as claimed in claim 1, wherein said first and second multi-emitter bipolar transistors are each a heterojunction bipolar transistor.

5. A semiconductor device comprising:

(a) a first multi-emitter bipolar transistor comprising:
      (a-1) a first element transistor having a first emitter, a first base, and a first collector electrodes;
      (a-2) a second element transistor having a second emitter, a second base, and a second collector electrodes;

(b) a second multi-emitter bipolar transistor comprising:
      (b-1) a third element transistor having a third emitter, a third base, and a third collector electrodes;
      (b-2) a fourth element transistor having a fourth emitter, a fourth base, and a fourth collector electrodes;

(c) a third multi-emitter bipolar transistor comprising:
      (c-1) a fifth element transistor having a fifth emitter, a fifth base, and a fifth collector electrodes;
      (c-2) a sixth element transistor having a sixth emitter, a sixth base, and a sixth collector electrodes;

(d) a first emitter terminal interconnecting said first and fourth emitter electrodes;

(e) a second emitter terminal interconnecting said second and third emitter electrodes;

(f) a third emitter terminal interconnecting said second base electrode and said fifth emitter electrode;

(g) a fourth emitter terminal interconnecting said first base electrode and said sixth emitter electrode; and (h) first, second, third, and fourth constant current sources respectively connected to said first, second, third, and fourth emitter terminals.

6. A semiconductor device as claimed in claim 5, further comprising:

(i) a first collector terminal interconnecting said first and second collector electrodes;

(j) a second collector terminal interconnecting said third and fourth collector electrodes; and (j) a third collector terminal interconnecting said fifth and sixth collector electrodes.

7. A semiconductor device as claimed in claim 6, wherein said third collector terminal is grounded.

8. A semiconductor device as claimed in claim 5, wherein said third collector terminal is applied with a constant potential.

9. A semiconductor device as claimed in claim 5, further comprising:

(l) a fourth multi-emitter bipolar transistor comprising:
      (l-1) a seventh element transistor having a seventh emitter, a seventh base, and a seventh collector electrodes;
      (l-2) an eighth element transistor having an eighth emitter, an eighth base, and an eight collector electrodes;

(m) a fifth emitter terminal interconnecting said third base electrode and said eighth emitter electrode;

(n) a sixth emitter terminal interconnecting said fourth base electrode and said seventh emitter electrode; and (o) fifth and sixth constant current sources respectively connected to said fifth and sixth emitter terminals.

10. A semiconductor device as claimed in claim 9, further comprising:

(p) a first input terminal interconnecting said fifth and sixth base electrodes; and (q) a second input terminal interconnecting said seventh and eighth base electrodes, wherein different signals are inputted to said first and second input terminals for differential amplification.

11. A semiconductor device as claimed in claim 6, wherein said first and second collector terminals are applied with a constant potential, said third collector terminal is connected to a load circuit, and said third collector terminal delivers an output current.

12. A semiconductor device as claimed in claim 5, wherein said first, second, and third multi-emitter bipolar transistors and said first, second, third, and fourth constant current sources are formed on the same semiconductor substrate.

13. A semiconductor device as claimed in claim 5, wherein at least one of said first, second, and third multi-emitter bipolar transistors is a heterojunction bipolar transistor.

14. A semiconductor device as claimed in claim 9, wherein said first, second, third, and fourth multi-emitter bipolar transistors are formed on the same semiconductor substrate.

15. A semiconductor device as claimed in claim 9, wherein at least one of said first, second, third and fourth multi-emitter bipolar transistors is a heterojunction bipolar transistor.

16. A semiconductor device comprising:

(a) a first multi-emitter bipolar transistor comprising:
  (a-1) a first element transistor having a first emitter, a first base, and a first collector electrodes;
  (a-2) a second element transistor having a second emitter, a second base, and a second collector electrodes;

(b) a second multi-emitter bipolar transistor comprising:
  (b-1) a third element transistor having a third emitter, third base, and a first collector electrodes;
  (b-2) a fourth element transistor having a fourth emitter, a fourth base, and a fourth collector electrodes;

(c) a third multi-emitter bipolar transistor comprising:
  (c-1) a fifth element transistor having a fifth emitter, a fifth base, and a fifth collector electrodes;
  (c-2) a sixth element transistor having a sixth emitter, a sixth base, and a sixth collector electrodes;

(d) a first emitter terminal interconnecting said first and fourth emitter electrodes;

(e) a second emitter terminal interconnecting said second and third emitter electrodes;

(f) a third emitter terminal interconnecting said second base electrode and said fifth emitter electrode;

(g) a fourth emitter terminal interconnecting said first base electrode and said sixth emitter electrode;

(h) first, second, third, and fourth constant current sources respectively connected to said first, second, third, and fourth emitter terminals;

(i) a first collector terminal interconnecting said first, second, fifth, and sixth collector electrode;

(j) a second collector terminal interconnecting said third and fourth collector electrodes;

(k) a first base terminal interconnecting said third and fourth base electrodes; and (l) a second base terminal interconnecting said fifth and sixth base electrodes, wherein said first collector and first base terminals are applied with a constant potential, said second base terminal is applied with an input signal, and said second collector terminal delivers an output current.

17. A semiconductor device as claimed in claim 16, wherein said first, second, and third multi-emitter bipolar transistors and said first, second, third, and fourth constant current sources are formed on the same semiconductor substrate.

18. A semiconductor device as claimed in claim 16, wherein at least one of said first, second, and third multi-emitter bipolar transistors is a heterojunction bipolar transistor.

19. A semiconductor device as claimed in claim 16, further comprising a semiconductor laser electrically coupled to said second collector terminal.

* * * * *